United States Patent
Floyd

(10) Patent No.: US 7,935,555 B2
(45) Date of Patent: May 3, 2011

(54) METHOD AND SYSTEM FOR SEALING A SUBSTRATE

(75) Inventor: Philip D Floyd, San Jose, CA (US)

(73) Assignee: QUALCOMM MEMS Technologies, Inc., San Diego, CA (US)

(*) Notice: Subject to any disclaimer, the term of this patent is extended or adjusted under 35 U.S.C. 154(b) by 0 days.

(21) Appl. No.: 12/628,024

(22) Filed: Nov. 30, 2009

(65) Prior Publication Data

US 2010/0072595 A1   Mar. 25, 2010

Related U.S. Application Data

(60) Division of application No. 11/842,916, filed on Aug. 21, 2007, now Pat. No. 7,629,678, which is a continuation of application No. 11/089,769, filed on Mar. 16, 2005, now Pat. No. 7,259,449.

(60) Provisional application No. 60/613,569, filed on Sep. 27, 2004.

(51) Int. Cl.
    *H01L 21/00* (2006.01)

(52) U.S. Cl. ... 438/50; 438/106; 438/680; 257/E21.007; 257/E21.058; 257/E21.17; 257/E21.231; 257/E21.278; 257/E21.329; 257/E21.502; 257/E21.503; 257/E21.128; 257/E29.324

(58) Field of Classification Search .......... 438/50, 438/106, 119, 680, 781, 782, 780; 257/E21.007, 257/17, 58, 499, 613, 231, 278, 329, 502, 257/503, 128, E29.324
See application file for complete search history.

(56) References Cited

U.S. PATENT DOCUMENTS

| | | | |
|---|---|---|---|
| 3,704,806 A | 12/1972 | Plachenov et al. |
| 3,900,440 A | 8/1975 | Ohara et al. |
| 4,036,360 A | 7/1977 | Deffeyes |
| 4,074,480 A | 2/1978 | Burton |
| 4,431,691 A | 2/1984 | Greenlee |
| 4,531,126 A | 7/1985 | Sadones |
| 4,552,806 A | 11/1985 | Hayashi et al. |
| 4,950,344 A | 8/1990 | Glover et al. |
| 4,954,789 A | 9/1990 | Sampsell |

(Continued)

FOREIGN PATENT DOCUMENTS

EP     1 093 162     4/2001

(Continued)

OTHER PUBLICATIONS

Jung et al., Soldered sealing process to assemble a protective cap for a MEMS CSP, Design, Test, Integration and Packaging of MEMS/MOEMS 2003 Symposium, pp. 255-260.

(Continued)

*Primary Examiner* — David Nhu
(74) *Attorney, Agent, or Firm* — Knobbe, Martens, Olson & Bear LLP

(57) ABSTRACT

A method of sealing a microelectromechanical system (MEMS) device from ambient conditions is described. The MEMS device is formed on a substrate and a substantially hermetic seal is formed as part of the MEMS device manufacturing process. The method may include forming a metal seal on the substrate proximate to a perimeter of the MEMS device using a method such as photolithography. The metal seal is formed on the substrate while the MEMS device retains a sacrificial layer between conductive members of MEMS elements, and the sacrificial layer is removed after formation of the seal and prior to attachment of a backplane.

15 Claims, 8 Drawing Sheets

U.S. PATENT DOCUMENTS

| | | | |
|---|---|---|---|
| 4,977,009 A | 12/1990 | Anderson et al. |
| 5,018,256 A | 5/1991 | Hornbeck |
| 5,075,796 A | 12/1991 | Schildkraut et al. |
| 5,091,983 A | 2/1992 | Lukosz |
| 5,095,375 A | 3/1992 | Bolt |
| 5,099,353 A | 3/1992 | Hornbeck |
| 5,172,262 A | 12/1992 | Hornbeck |
| 5,212,582 A | 5/1993 | Nelson |
| 5,216,537 A | 6/1993 | Hornbeck |
| 5,244,707 A | 9/1993 | Shores |
| 5,293,511 A | 3/1994 | Poradish et al. |
| 5,304,419 A | 4/1994 | Shores |
| 5,381,253 A | 1/1995 | Sharp et al. |
| 5,547,823 A | 8/1996 | Murasawa et al. |
| 5,550,373 A | 8/1996 | Cole et al. |
| 5,553,440 A | 9/1996 | Bulger et al. |
| 5,559,358 A | 9/1996 | Burns et al. |
| 5,591,379 A | 1/1997 | Shores |
| 5,646,729 A | 7/1997 | Koskinen et al. |
| 5,703,710 A | 12/1997 | Brinkman et al. |
| 5,739,945 A | 4/1998 | Tayebati |
| 5,815,141 A | 9/1998 | Phares |
| 5,835,255 A | 11/1998 | Miles |
| 5,853,662 A | 12/1998 | Watanabe |
| 5,939,785 A | 8/1999 | Klonis et al. |
| 5,986,796 A | 11/1999 | Miles |
| 6,040,937 A | 3/2000 | Miles |
| 6,055,090 A | 4/2000 | Miles |
| 6,238,755 B1 | 5/2001 | Harvey et al. |
| 6,355,328 B1 | 3/2002 | Baratuci et al. |
| 6,455,927 B1 | 9/2002 | Glenn et al. |
| 6,467,139 B1 | 10/2002 | Tanaka |
| 6,489,670 B1 | 12/2002 | Peterson et al. |
| 6,495,895 B1 | 12/2002 | Peterson et al. |
| 6,538,312 B1 | 3/2003 | Peterson et al. |
| 6,582,789 B1 | 6/2003 | Sumi |
| 6,589,625 B1 | 7/2003 | Kothari et al. |
| 6,603,182 B1 | 8/2003 | Low et al. |
| 6,621,134 B1 | 9/2003 | Zurn |
| 6,646,709 B2 | 11/2003 | Matsumoto |
| 6,650,455 B2 | 11/2003 | Miles |
| 6,661,084 B1 | 12/2003 | Peterson et al. |
| 6,674,159 B1 | 1/2004 | Peterson et al. |
| 6,674,562 B1 | 1/2004 | Miles et al. |
| 6,680,792 B2 | 1/2004 | Miles |
| 6,709,750 B1 | 3/2004 | Pohlmann et al. |
| 6,743,656 B2 | 6/2004 | Orcutt et al. |
| 6,791,660 B1 | 9/2004 | Hayashi et al. |
| 6,838,309 B1 | 1/2005 | McCann |
| 6,867,896 B2 | 3/2005 | Miles |
| 6,872,984 B1 | 3/2005 | Leung |
| 6,999,225 B2 | 2/2006 | Lin et al. |
| 7,012,726 B1 | 3/2006 | Miles |
| 7,012,732 B2 | 3/2006 | Miles |
| 7,015,885 B2 | 3/2006 | Novotny et al. |
| 7,034,984 B2 | 4/2006 | Pan et al. |
| 7,042,643 B2 | 5/2006 | Miles et al. |
| 7,060,895 B2 | 6/2006 | Kothari et al. |
| 7,119,945 B2 | 10/2006 | Kothari et al. |
| 7,123,216 B1 | 10/2006 | Miles |
| 7,126,741 B2 | 10/2006 | Wagner et al. |
| 7,130,104 B2 | 10/2006 | Cummings |
| 7,136,213 B2 | 11/2006 | Chui |
| 7,138,984 B1 | 11/2006 | Miles |
| 7,142,346 B2 | 11/2006 | Chui et al. |
| 7,164,520 B2 | 1/2007 | Palmateer et al. |
| 7,259,449 B2 | 8/2007 | Floyd |
| 7,307,776 B2 | 12/2007 | Miles et al. |
| 7,317,281 B2 | 1/2008 | Hayashi et al. |
| 7,381,583 B1 | 6/2008 | Ebel et al. |
| 7,385,748 B2 | 6/2008 | Miles |
| RE40,436 E | 7/2008 | Kothari et al. |
| 7,471,444 B2 | 12/2008 | Miles |
| 7,532,385 B2 | 5/2009 | Lin |
| 7,642,127 B2* | 1/2010 | Floyd ............................ 438/106 |
| 2002/0000649 A1 | 1/2002 | Tilmans et al. |
| 2002/0056900 A1 | 5/2002 | Liu et al. |
| 2002/0075551 A1 | 6/2002 | Daneman |
| 2002/0075555 A1 | 6/2002 | Miles |
| 2002/0121909 A1 | 9/2002 | Sato et al. |
| 2002/0126364 A1 | 9/2002 | Miles |
| 2002/0146200 A1 | 10/2002 | Kudrle et al. |
| 2002/0160583 A1 | 10/2002 | Song |
| 2002/0187254 A1 | 12/2002 | Ghosh |
| 2003/0053233 A1 | 3/2003 | Felton |
| 2003/0054588 A1 | 3/2003 | Patel et al. |
| 2003/0062186 A1 | 4/2003 | Boroson et al. |
| 2003/0075794 A1 | 4/2003 | Felton et al. |
| 2003/0103185 A1 | 6/2003 | Kim et al. |
| 2003/0104651 A1 | 6/2003 | Kim et al. |
| 2003/0108306 A1 | 6/2003 | Whitney et al. |
| 2003/0143423 A1 | 7/2003 | McCormick et al. |
| 2003/0155643 A1 | 8/2003 | Freidhoff |
| 2003/0183916 A1 | 10/2003 | Heck et al. |
| 2003/0184412 A1 | 10/2003 | Gorrell |
| 2003/0214007 A1 | 11/2003 | Tao et al. |
| 2004/0048037 A1 | 3/2004 | Klausmann et al. |
| 2004/0061492 A1 | 4/2004 | Lopes et al. |
| 2004/0066258 A1 | 4/2004 | Cohn et al. |
| 2004/0070706 A1 | 4/2004 | Freeman |
| 2004/0100677 A1 | 5/2004 | Huibers et al. |
| 2004/0140557 A1 | 7/2004 | Sun et al. |
| 2004/0184133 A1 | 9/2004 | Su et al. |
| 2004/0232535 A1 | 11/2004 | Tarn |
| 2005/0023976 A1 | 2/2005 | Wang |
| 2005/0036192 A1 | 2/2005 | Lin et al. |
| 2005/0046919 A1 | 3/2005 | Taguchi et al. |
| 2005/0046922 A1 | 3/2005 | Lin et al. |
| 2005/0074919 A1 | 4/2005 | Patel et al. |
| 2005/0093134 A1 | 5/2005 | Tarn |
| 2005/0167795 A1 | 8/2005 | Higashi |
| 2005/0253283 A1 | 11/2005 | Dcamp et al. |
| 2005/0254115 A1 | 11/2005 | Palmateer |
| 2005/0258516 A1 | 11/2005 | Hong et al. |
| 2006/0152106 A1 | 7/2006 | Yan et al. |
| 2006/0197215 A1* | 9/2006 | Potter ............................ 257/704 |

FOREIGN PATENT DOCUMENTS

| | | |
|---|---|---|
| EP | 1 418 154 | 5/2004 |
| EP | 1 457 804 | 9/2004 |
| FR | 2841380 | 12/2003 |
| JP | 59-6842 | 1/1984 |
| JP | 04-085859 | 3/1992 |
| JP | 11-145337 | 5/1999 |
| WO | WO 01/45140 | 6/2001 |
| WO | WO 02/42716 | 5/2002 |
| WO | WO 03/009318 | 1/2003 |
| WO | WO 03/026369 | 3/2003 |
| WO | WO 03/105198 | 12/2003 |
| WO | WO 2004/025727 | 3/2004 |
| WO | WO 2005/113376 | 12/2005 |
| WO | WO 2005/114294 | 12/2005 |

OTHER PUBLICATIONS

Kim et al., Fabrication and characteriziation of a low-temperature hermetic MEMS package bonded by a closed loop AuSn solder-line, Proceedings of the IEEE 16th Annual International Conference on Micro Electro Mechanical Systems, Jan. 2003, pp. 614-617.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Maharbiz et al., Batch micropackaging by compression-bonded wafer-wafer transfer, Twelfth IEEE International Conference on Micro Electro Mechanical Systems, Jan. 17-21, 1999, pp. 482-489.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Tao et al., Selective Bonding and encapsulation for wafer-level vacuum packaging of mems and related micro systems, Microelectronics and Reliability, 44(2):251-258, Feb. 2004.

Tilmans et al., The indent reflow sealing (IRS) technique—A method for the fabrication of scaled cavities for mems devices, Journal of Microelectromechanical Systems, 9(2), Jun. 2000.

Tominetti, et al., Moisture and impurities detection and removal in packaged MEMS, Proceedings of the SPIE, Reliability, Testing and Characterization of MEMS/MOEMS, Oct. 2001, pp. 215-225.

Yang et al., Localized induction heating solder bonding for wafer level MEMS packaging, 17th IEEE International Conference on Micro Electro Mechanical Systems, Jan. 2004, pp. 729-732.

Office Action dated Dec. 22, 2006 in U.S. App. No. 11/089,769.

Extended European Search Report for App. No. 05255659.4, dated Nov. 6, 2007.

Office Action dated Nov. 18, 2008 in U.S. App. No. 11/779,185.

Office Action dated May 11, 2009 in U.S. App. No. 11/779,185.

Office Action in Chinese App. No. 200510103553.0, dated Mar. 28, 2008.

Office Action in Chinese App. No. 200510103553.0, dated Oct. 24, 2008.

Office Action in Chinese App. No. 200510103553.0, dated Mar. 13, 2009.

Notice of Reasons for Rejection in Japanese App. No. 2005-236246 dated May 20, 2008.

Substantive Examination Report and Search Report dated Jun. 19, 2009 in Malaysian App. No. PI20053561.

Office Action dated Jan. 9, 2009 in U.S. App. No. 11/842,916.

Office Action in Chinese App. No. 200510103553.0, dated Jun. 26, 2009.

Examiner's report dated Aug. 18, 2009 in Australian App. No. 2005203429.

He et al., Jan. 30-Feb. 3, 2005, On-chip hermetic packaging enabled by post-deposition electrochemical etching of polysilicon, 18th IEEE Conf. on MEMS Proceedings, pp. 544-547.

First Examination Report dated Nov. 18, 2010 in Indian Patent App. No. 1026/MUM/2005.

* cited by examiner

| | Column Output Signals | |
|---|---|---|
| | $+V_{bias}$ | $-V_{bias}$ |
| Row Output Signals  0 | Stable | Stable |
| $+\Delta V$ | Release | Actuate |
| $-\Delta V$ | Actuate | Release |

METHOD AND SYSTEM FOR SEALING A SUBSTRATE

CROSS REFERENCE TO RELATED APPLICATIONS

This application is a divisional of U.S. application Ser. No. 11/842,916, filed Aug. 21, 2007, now issued U.S. Pat. No. 7,629,678, which is a continuation of U.S. application Ser. No. 11/089,769, filed on Mar. 16, 2005, now U.S. Pat. No. 7,259,449, which claims priority to U.S. Provisional Patent Application No. 60/613,569, filed on Sep. 27, 2004. The disclosure of each of the above-described filed applications is hereby incorporated by reference in its entirety.

BACKGROUND

1. Field of the Invention

The field of the invention relates to microelectromechanical systems (MEMS), and more particularly to a method of sealing a MEMS device from ambient conditions.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In one aspect, an electronic device including a micro-electromechanical systems (MEMS) device, a metal layer, a mask, a metal seal layer, and a backplane is prepared by a process comprising the steps of providing a MEMS device on a substrate; depositing a metal layer on the substrate; forming a mask with one or more perimeter cavities over the metal layer; depositing one or more metal seal layers in the one or more perimeter cavities, thereby forming a seal proximate to the perimeter of the MEMS device; and joining a backplane to the seal.

In some embodiments, the MEMS device comprises an interferometric modulator. In some embodiments, the MEMS device is further prepared by a process comprising removing the mask, and the metal layer, at areas not covered by the one or more metal seal layers, thereby forming a sealant wall. In some embodiments, the MEMS device is further prepared by a process comprising removing a sacrificial layer from the MEMS device. In some embodiments, the MEMS device is further prepared by a process comprising applying a desiccant between the MEMS device and the backplane. In some embodiments, the desiccant is selected from the group consisting of zeolites, molecular sieves, surface adsorbents, bulk adsorbents and chemical reactants. In some embodiments, the desiccant comprises a powder. In some embodiments, the seal proximate to the perimeter of the MEMS device comprises a non-hermetic seal. In some embodiments, the non-hermetic seal is selected from the group consisting of conventional epoxy-based adhesive, polyisobutylene, butyl rubber, o-rings, polyurethane, thin film metal weld, liquid spin-on glass, solder, polymers and plastic. In some embodiments, the seal proximate to the perimeter of the MEMS device comprises a substantially hermetic seal. In some embodiments, the substantially hermetic seal comprises metal.

In some embodiments, the MEMS device is further prepared by depositing an insulator layer on the substrate before depositing the metal layer. In some embodiments, the depositing the insulator layer comprises depositing the insulator layer to contact the substrate. In some embodiments, the depositing the insulator layer comprises depositing the insulator layer on at least one layer in contact with the substrate. In some embodiments, the at least one layer comprises a conductive material.

In another aspect, a method of sealing a microelectromechanical system (MEMS) device from ambient conditions comprises forming a substantially metal seal on a substrate comprising a MEMS device, and attaching a backplane to the metal seal so as to seal the MEMS device from ambient conditions.

Forming the substantially metal seal may comprise forming an insulator layer on the substrate, and forming a metal sealant wall on the insulator layer, and the method may further comprise forming an adhesive layer on the metal seal for attachment of the backplane. In some embodiments, attaching the backplane comprises soldering.

Another aspect of a method of sealing a MEMS device from ambient conditions comprises forming a MEMS device on a substrate, wherein the MEMS device comprises a sacrificial layer, depositing an insulator layer over the MEMS device and the substrate, depositing one or more metal layers over the insulator layer, and forming a mask with one or more cavities over the one or more metal layers, wherein the cavities define a perimeter around the MEMS device. The method further comprises forming one or more metal seal layers in the one or more cavities in the mask, thereby forming a substantially hermetic seal proximate to the perimeter of the MEMS device, removing the mask layer, the one or more metal layers, and the insulating layer to form a sealant wall around the perimeter of the MEMS device, removing the sacrificial layer from the MEMS device, and attaching a backplane to the sealant wall to seal the MEMS device from ambient conditions.

In some embodiments, forming the one or more metal seal layers comprises electroplating over the mask layer. In certain embodiments, the mask comprises photoresist, wherein forming the mask comprises the use of UV light.

The method may further comprise forming one or more adhesion metal layers over the one or more metal seal layers, wherein the one or more adhesion metal layers are configured for attachment to the backplane. The one or more adhesion layers may comprise a solder, for example.

In some embodiments, the one or metal layers deposited over the insulator layer comprise at least one of a metal seed layer and an adhesion layer. In some embodiments, the backplane comprises a pre-deposited adhesion layer configured to adhere to the sealant wall.

Attaching the backplane to the sealant wall may comprise soldering, and the backplane may comprise an adhesion layer and a solder layer proximate to an area for attachment to the sealant wall, wherein the adhesion layer comprises metal, for example.

Yet another aspect of a method of packaging a MEMS device comprises depositing an insulator over a MEMS device formed on a substrate, wherein the MEMS device includes a sacrificial layer, depositing one or more metal layers over the insulator, and forming a mask with one or more cavities over the metal layer. The method further comprises forming one or more metal seal layers in the one or more cavities, thereby forming a substantially hermetic seal proximate to a perimeter of the MEMS device, removing the mask layer, the one or more metal layers, and the insulating layer, removing the sacrificial layer from the MEMS device, and positioning a backplane in contact with the seal so as to seal the MEMS device from ambient conditions.

In some embodiments, forming one or more metal seal layers comprises electroplating over the mask layer, and the mask may comprise photoresist, wherein forming the mask comprises the use of UV light.

The method may further comprise forming one or more adhesion metal layers over the one or more metal seal layers, wherein the one or more adhesion metal layers are configured for attachment to the backplane, and the one or more adhesion layers may comprise a solder, for example.

The one or metal layers deposited over the insulator layer may comprise at least one of a metal seed layer and an adhesion layer, and the backplane may comprise a pre-deposited adhesion layer configured to adhere to the sealant wall.

In some embodiments, attaching the backplane to the sealant wall comprises soldering. The backplane may comprise an adhesion layer and a solder layer proximate to an area for attachment to the sealant wall, and the adhesion layer may comprise metal, for example.

In another aspect, a system for sealing a MEMS device from ambient conditions comprises a MEMS device formed on a substrate, means for providing a substantially metal seal on the substrate and proximate to a perimeter of the MEMS device, thereby forming a substantially hermetic seal proximate to a perimeter of the MEMS device, and a backplane in contact with the substantially metal seal, thereby encapsulating the MEMS device within the substrate, the substantially metal seal, and the backplane.

The system may further comprise means for forming one or more adhesion metal layers over the one or more metal seal layers, wherein the one or more adhesion metal layers are configured for attachment to a backplane. The one or more adhesion layers may comprise a solder, for example. In addition, the metal seal may comprise at least one of a metal seed layer and an adhesion layer.

In certain embodiments, the system further comprises means for attaching the backplane to the metal seal. The means for attaching the backplane may comprise a pre-deposited adhesion layer configured to adhere to the metal seal. The means for attaching the backplane may comprise a solder. In some embodiments, the means for attaching the backplane comprises an adhesion layer and a solder layer on the backplane proximate to an area for attachment to the metal seal, and the adhesion layer may comprise metal, for example.

In another aspect, a MEMS device sealed from ambient conditions comprises a MEMS device formed on a substrate, a substantially metal seal formed on the substrate proximate to a perimeter of the MEMS device, and a backplane in contact with the substantially metal seal, thereby encapsulating the MEMS device within the substrate, the substantially metal seal, and the backplane.

DETAILED DESCRIPTION OF PREFERRED EMBODIMENTS

One embodiment of the invention is a MEMS based device package comprising a MEMS device on a substrate, wherein a seal is positioned proximate to a perimeter of the MEMS device and a backplane is joined to the seal so as create a cavity to encapsulate the MEMS device. The seal preferably comprises one or more metal layers insulated from the substrate, wherein the seal is configured to prevent moisture from entering the package.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
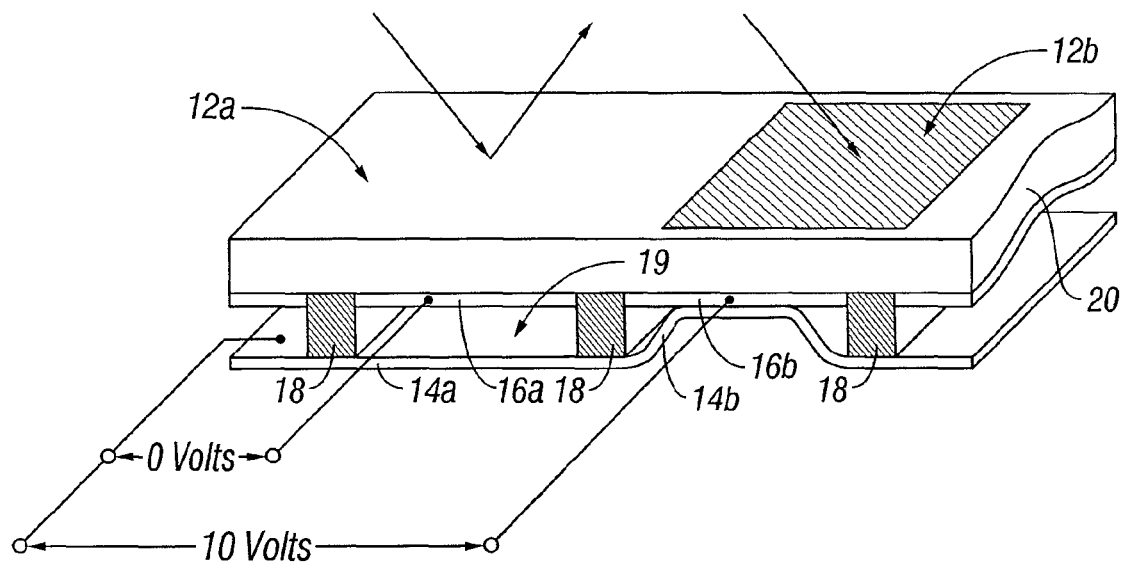
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
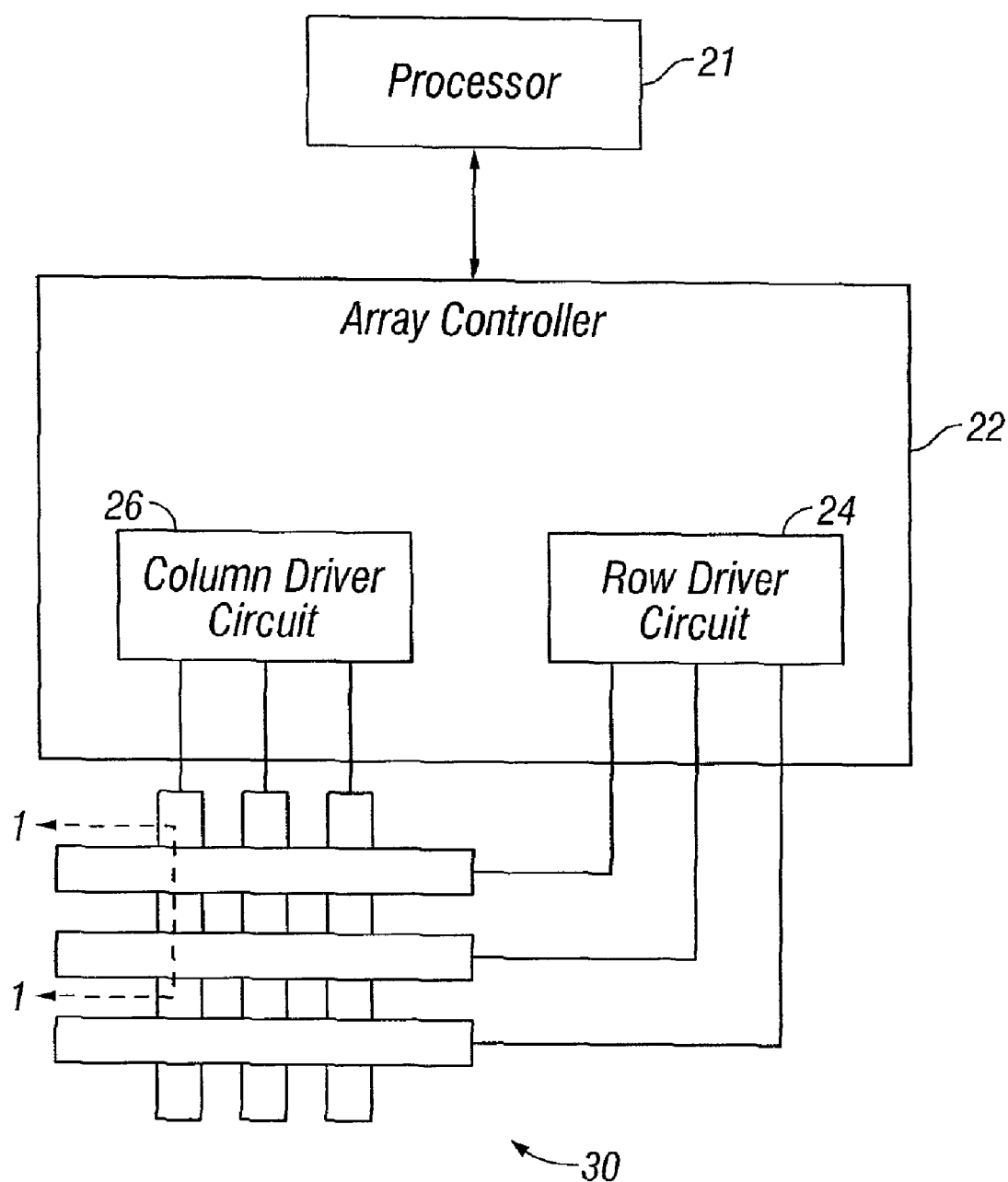
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
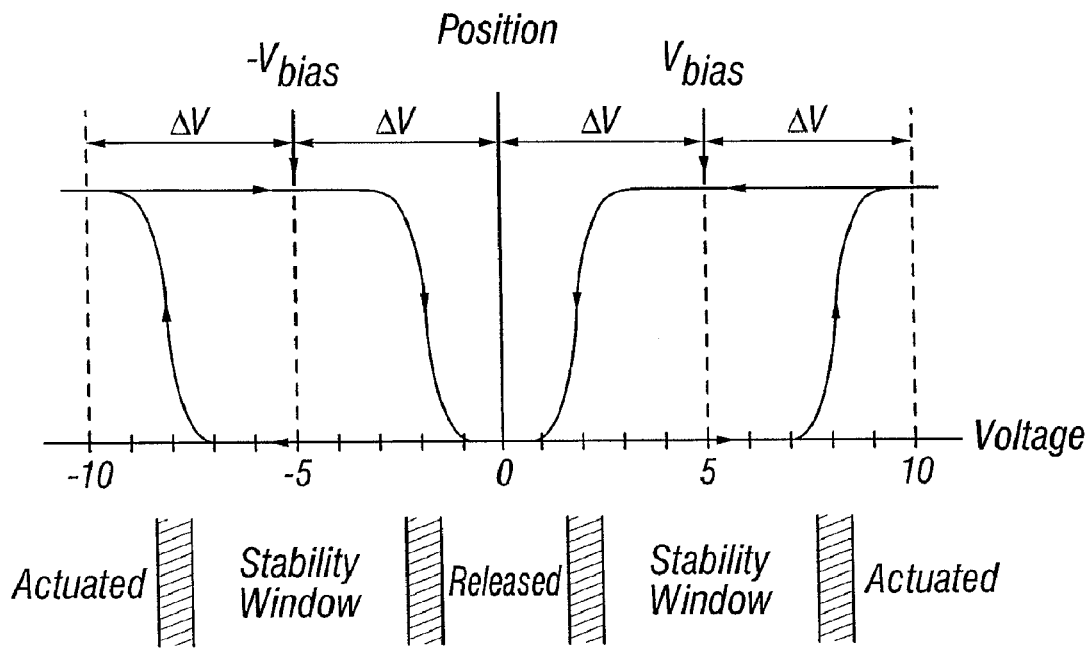
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
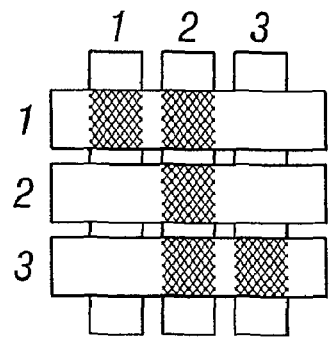
FIGS. 5A and 5B illustrate one exemplary timing diagram for row and column signals that may be used to write a frame of display data to the 3×3 interferometric modulator display of FIG. 2.
Figure 5B:
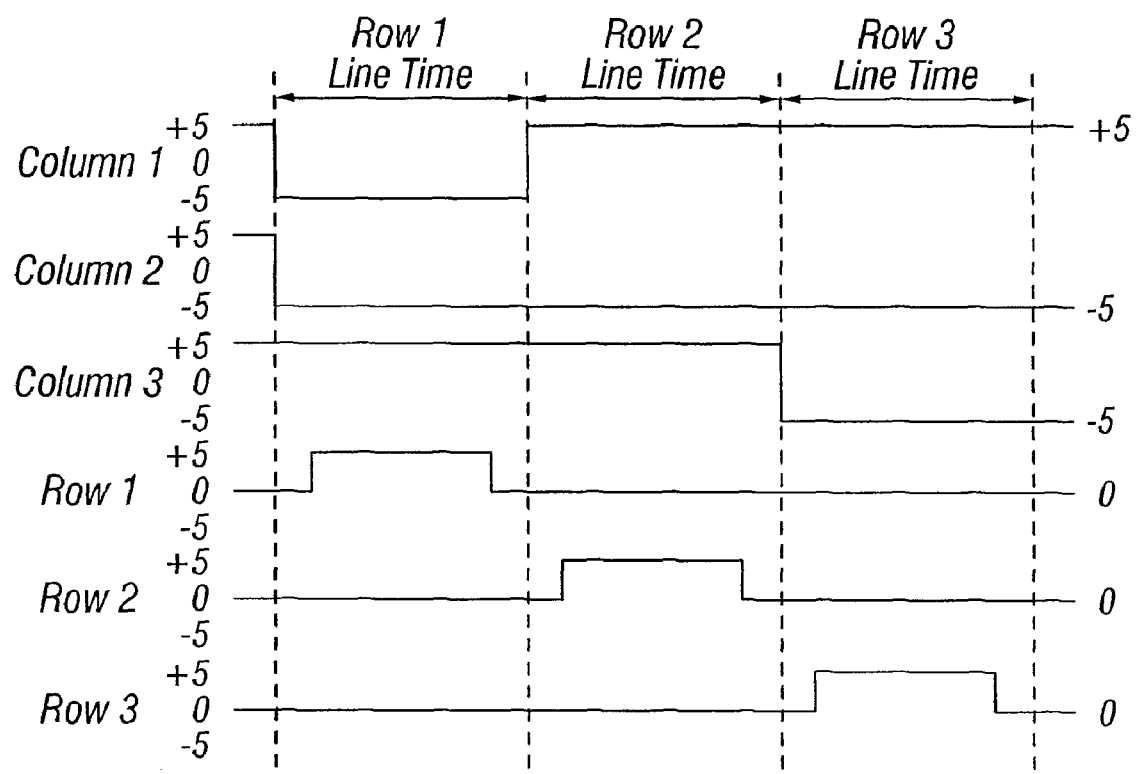

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
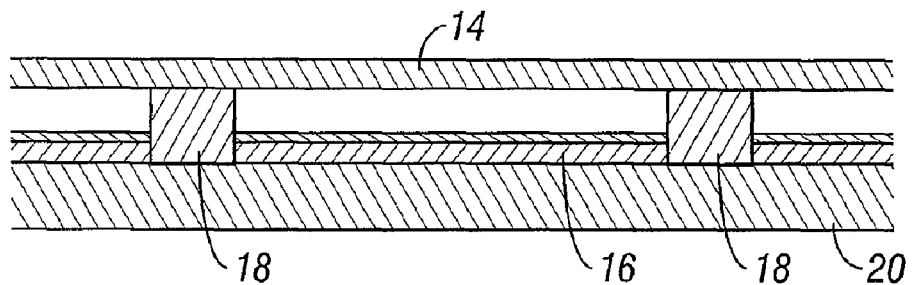
FIG. 6A is a cross section of the device of FIG. 1.
Figure 6B:
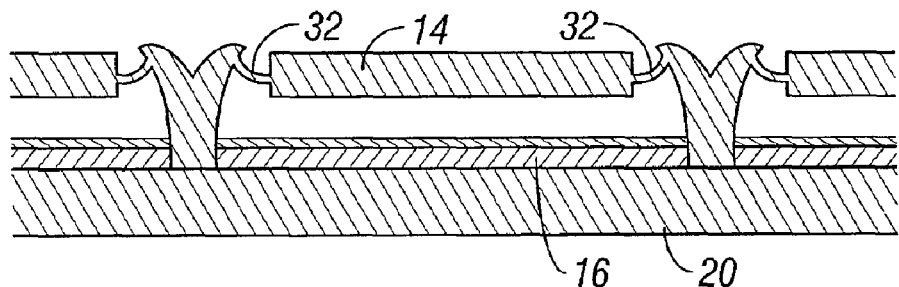
FIG. 6B is a cross section of an alternative embodiment of an interferometric modulator.
Figure 6C:
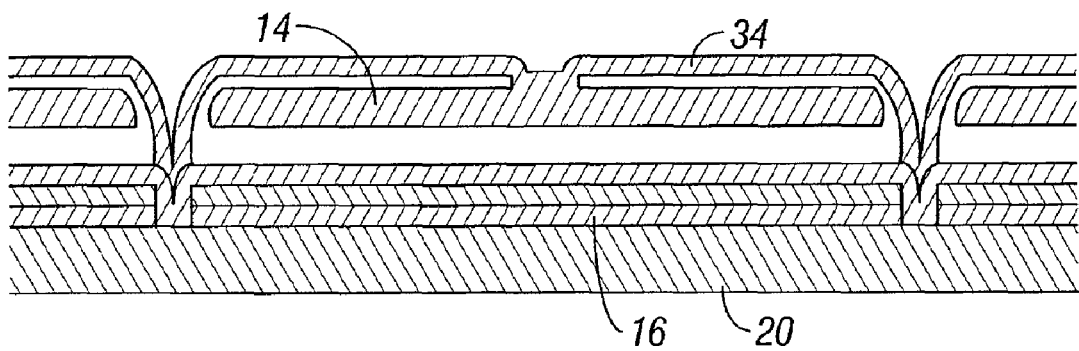
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 7A:
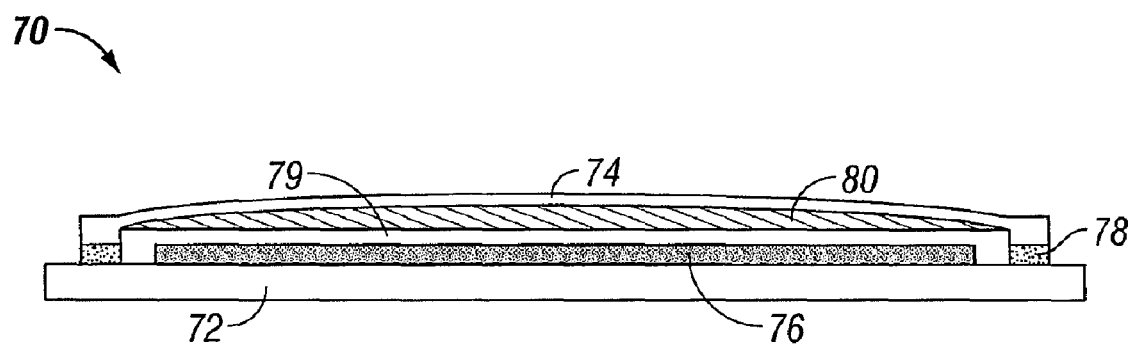
FIG. 7A is a cross-sectional view of a basic package structure for an interferometric modulator device.

The moving parts of a MEMS device, such as an interferometric modulator array, preferably have a protected space in which to move. Packaging techniques for a MEMS device will be described in more detail below. A schematic of a basic package structure for a MEMS device, such as an interferometric modulator array, is illustrated in FIG. 7A. As shown in FIG. 7A, a basic package structure 70 includes a substrate 72 and a backplane cover or "cap" 74, wherein an interferometric modulator array 76 is formed on the substrate 72. This cap 74 is also called a "backplane".

The substrate 72 and the backplane 74 are joined by a seal 78 to form the package structure 70, such that the interferometric modulator array 76 is encapsulated by the substrate 72, backplane 74, and the seal 78. This forms a cavity 79 between the backplane 74 and the substrate 72. The seal 78 may be a non-hermetic seal, such as a conventional epoxy-based adhesive. In other embodiments, the seal 78 may be a polyisobutylene (sometimes called butyl rubber, and other times PIB), o-rings, polyurethane, thin film metal weld, liquid spin-on glass, solder, polymers, or plastics, among other types of seals that may have a range of permeability of water vapor of about 0.2-4.7 g mm/m²kPa day. In still other embodiments, the seal 78 may be a hermetic seal.

In some embodiments, the package structure 70 includes a desiccant 80 configured to reduce moisture within the cavity 79. The skilled artisan will appreciate that a desiccant may not be necessary for a hermetically sealed package, but may be desirable to control moisture resident within the package. In one embodiment, the desiccant 80 is positioned between the interferometric modulator array 76 and the backplane 74. Desiccants may be used for packages that have either hermetic or non-hermetic seals. In packages having a hermetic seal, desiccants are typically used to control moisture resident within the interior of the package. In packages having a non-hermetic seal, a desiccant may be used to control moisture moving into the package from the environment. Generally, any substance that can trap moisture while not interfering with the optical properties of the interferometric modulator array may be used as the desiccant 80. Suitable desiccant materials include, but are not limited to, zeolites, molecular sieves, surface adsorbents, bulk adsorbents, and chemical reactants.

The desiccant 80 may be in different forms, shapes, and sizes. In addition to being in solid form, the desiccant 80 may alternatively be in powder form. These powders may be inserted directly into the package or they may be mixed with an adhesive for application. In an alternative embodiment, the desiccant 80 may be formed into different shapes, such as cylinders or sheets, before being applied inside the package.

The skilled artisan will understand that the desiccant 80 can be applied in different ways. In one embodiment, the desiccant 80 is deposited as part of the interferometric modulator array 76. In another embodiment, the desiccant 80 is applied inside the package 70 as a spray or a dip coat.

The substrate 72 may be a semi-transparent or transparent substance capable of having thin film, MEMS devices built upon it. Such transparent substances include, but are not limited to, glass, plastic, and transparent polymers. The interferometric modulator array 76 may comprise membrane modulators or modulators of the separable type. The skilled artisan will appreciate that the backplane 74 may be formed of any suitable material, such as glass, metal, foil, polymer, plastic, ceramic, or semiconductor materials (e.g., silicon).

The packaging process may be accomplished in a vacuum, pressure between a vacuum up to and including ambient pressure, or pressure higher than ambient pressure. The packaging process may also be accomplished in an environment of varied and controlled high or low pressure during the sealing process. There may be advantages to packaging the interferometric modulator array 76 in a completely dry environment, but it is not necessary. Similarly, the packaging environment may be of an inert gas at ambient conditions. Packaging at ambient conditions allows for a lower cost process and more potential for versatility in equipment choice because the device may be transported through ambient conditions without affecting the operation of the device.

Generally, it is desirable to minimize the permeation of water vapor into the package structure and thus control the environment inside the package structure 70 and hermetically seal it to ensure that the environment remains constant. When the humidity within the package exceeds a level beyond which surface tension from the moisture becomes higher than the restoration force of a movable element (not shown) in the interferometric modulator 10, the movable element may become permanently stuck to the surface.

As noted above, a desiccant may be used to control moisture resident within the package structure 70. However, the need for a desiccant can be reduced or eliminated with the implementation of a hermetic seal 78 to prevent moisture from traveling from the atmosphere into the interior of the package structure 70.

The continued reduction in display device dimensions restricts available methods to manage the environment within the package structure 70 because there is less area to place a desiccant 80 within the package structure 70. Although the area of a packaging structure susceptible to influx of water vapor may remain the same or be slightly reduced as package structures are reduced in size, the area available for a desiccant is reduced dramatically in comparison. The elimination of the need for a desiccant also allows the package structure 70 to be thinner, which is desirable in some embodiments. Typically, in packages containing desiccants, the lifetime expectation of the packaged device may depend on the lifetime of the desiccant. When the desiccant is fully consumed, the interferometric modulator device may fail as sufficient moisture enters the package structure and damages the interferometric modulator array.

Figure 7B:
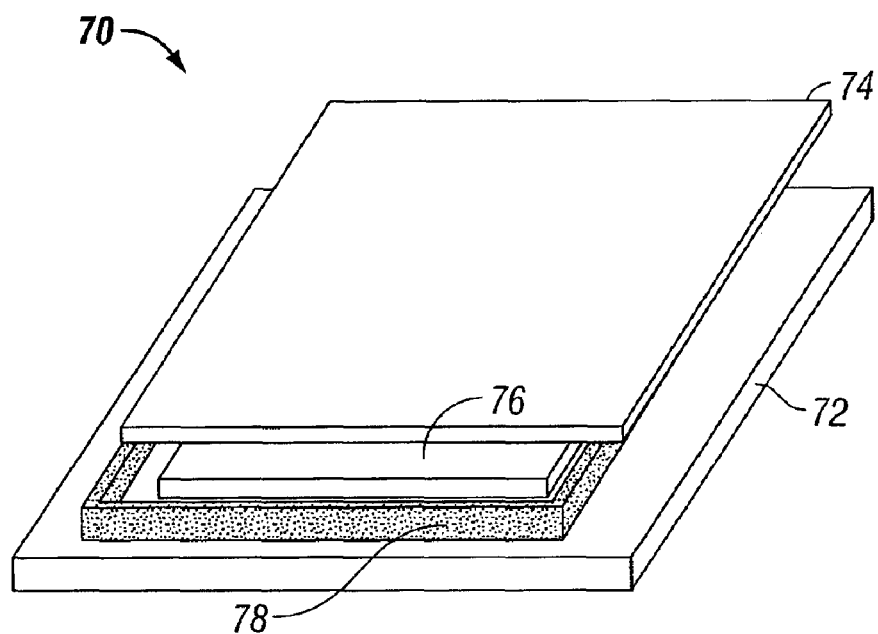
FIG. 7B is an isometric view of the package structure of FIG. 7A with a metal seal.

In one embodiment, the seal 78 comprises a plated metal that forms a barrier configured to act as an environmental barrier inhibiting or preventing moisture flow therethrough. FIG. 7B is an isometric illustration of a packaging structure 70 with a metal seal 78. In one embodiment, the seal 78 is a hermetic seal that prevents air and water vapor flow through the seal 78. The metal seal 78 is preferably formed according to a photolithographic process and allows for positioning of the seal 78 within +/−1 μm of a desired position.

FIGS. 8A-8E are cross-sectional views illustrating different stages of one embodiment of a method of forming the seal 78 illustrated in FIG. 7B, and packaging a MEMS device such as the interferometric modulator array 76.

Figure 8A:
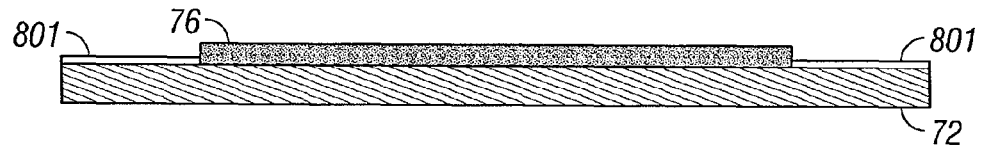
FIGS. 8A-8E are cross-sectional views illustrating progressive stages of one embodiment of a method of forming a metal seal and packaging a MEMS device.
Figure 8B:
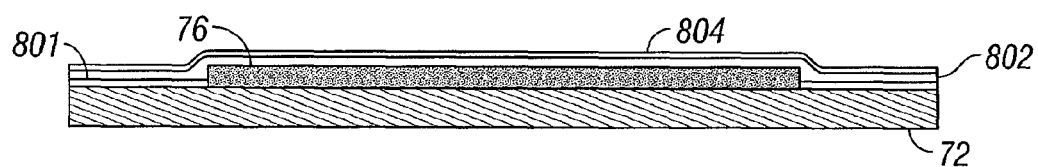

FIG. 8A is a cross-sectional view illustrating the interferometric modulator array 76 formed on the substrate 72. In one embodiment, the interferometric modulator array 76 still comprises a sacrificial layer (not shown) between the conductive members, such as the conductive members 14, 16 illustrated in FIG. 1, of the interferometric modulator elements of the array 76. The sacrificial layer may comprise molybdenum, for example. In reference to FIG. 8B, conductive leads 801 on the substrate 72 are electrically isolated from the seal by depositing an insulator 802 over the substrate 72. In certain embodiments, the insulator 802 is also deposited over the interferometric modulator array 76, as illustrated in FIG. 8B. In some embodiments, the insulator 802 may be applied to a location on the substrate 72 where the seal 78 is to be formed. However, it may be more practical to form the insulator 802 by deposition on top of the substrate 72 and interferometric modulator array 76 as illustrated in FIG. 8B, and subsequently remove undesired portions of the insulator 802. The insulator can be formed, for example, by thin film deposition methods such as sputtering or chemical vapor deposition (CVD). In one embodiment, the insulator is $SiO_2$ or other insulating oxide or nitride, and has a thickness of about 2000 Å or less, or about 1000 Å or less. As will be appreciated by those skilled in the technology, other methods of deposition of the insulator and alternative insulator materials are within the scope of the invention.

Following deposition of the insulator 802, one or more metal layers 804 for electroplating are deposited directly on top of the insulator 802. The metal layer 804 may comprise a plurality of layers, and in one embodiment, the metal layers 804 include an adhesion layer and a metal seed layer. The adhesion layer preferably promotes adhesion between the insulator and the metal seed layer. In certain embodiments, the metal seed layer is a conductive plating base upon which electrodeposit is formed and does not need to be the same material as the electrodeposit. In one embodiment, the metal seed layer has a thickness of about 500-2000 Å and the adhesion layer has a thickness of about 50-100 Å. In one embodiment, the combined thickness of the adhesion layer and the metal seed layer is about 100-500 Å. In some embodiments, the adhesion layer comprises different types of metal, such as titanium (Ti) or chromium (Cr). The skilled artisan will understand that it is also possible to dispense with the adhesion layer if the surface to which the metal seed layer is to be attached is rough, for example.

Figure 8C:
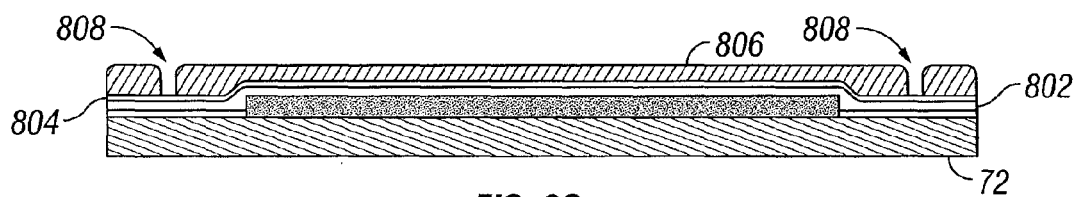

As illustrated in FIG. 8C, a mask 806 is patterned over the metal layers 804 to define one or more cavities 808 for the formation of the sealant wall proximate to a perimeter of the interferometric modulator array 76. The perimeter cavity 808 may be square or rectangular, or may have other geometries.

In an embodiment of the package structure 70 containing more than one interferometric modulator arrays 76, the seal 78 is positioned around a total perimeter of the plurality of interferometric modulator arrays. In one embodiment, the metal layers 804 are deposited after patterning the mask 806, such that the metal layers 804 are deposited on the insulator 802 only in the cavities 808.

The mask 806 preferably comprises photoresist and can be patterned using UV light, for example. The photoresist can comprise an organic polymer that becomes soluble when exposed to ultraviolet light and prevents etching or plating of the area it covers (this is also known as resist). Photoresist and the use thereof is well known in various industries such as semiconductor, biomedical engineering, holographic, electronics, and nanofabrication. In certain embodiments, the use of photoresist as the mask is preferable so as to define thick layers with precision.

Figure 8D:
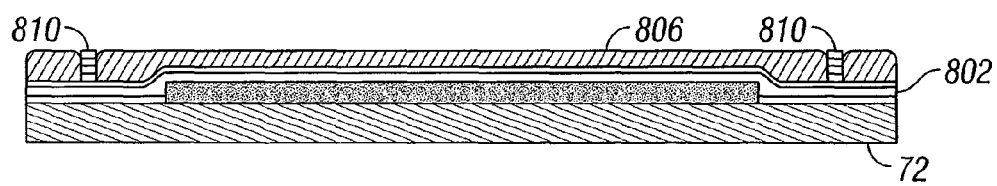

As illustrated in FIG. 8D, one or more layers of metal are deposited onto the exposed metal seed layer 804 in the cavity 808, thereby forming a sealant wall 810. Deposition of the one or more metal layers preferably comprises electroplating using an electroplating bath. Other methods of depositing or forming the metal layers are contemplated, including, for example, electroless plating.

In one embodiment, the thickness of the mask 806 is dependent upon the desired thickness or height of the sealant wall 810, wherein the thickness of the mask 806 is substantially the same or slightly greater than the desired height of the sealant wall 810. In certain embodiments, the mask 806 is thicker than the desired height of the sealant wall 810, or less thick than the desired height of the sealant wall 810. In one embodiment, the height of the sealant wall 810 is about 10-70 µm. In some embodiments, the height of the sealant wall 810 is about 30-50 µm. Other heights for the sealant wall 810 are contemplated.

Figure 8E:
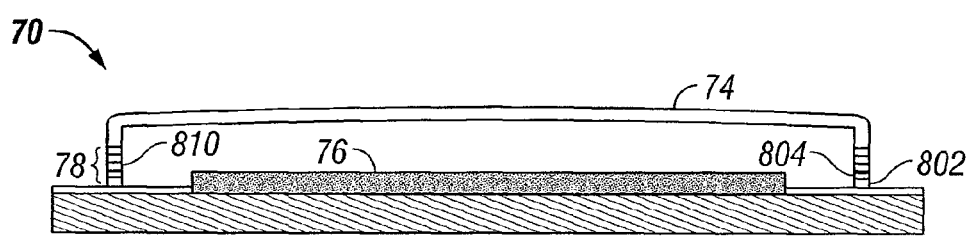

As illustrated in FIG. 8E, the mask 806, metal layers 804, and insulator 802 are removed at areas not covered by the electroplated metal 808 by a method such as a wet chemical etch. Alternatively, the metal layers 804 and insulator 802 may each be removed in separate steps. In the embodiment wherein the metal seed layer is deposited on top of the mask 806, the metal seed layer is removed with the mask 806. Prior to joining the backplane 74 to the seal 78, the sacrificial layer present in the interferometric modulator array 76 is etched, using $XeF_2$ gas for example, to release the membranes or conductive members of the interferometric modulator elements of the array 76.

After the sacrificial layer is removed from the interferometric modulator array 76, the backplane 74 is joined to the seal 78, which includes the insulator 802 and sealant wall 810, to form the package structure 70. The skilled artisan will appreciate that the backplane 74 may be formed of any suitable material, such as glass, metal, foil, polymer, plastic, ceramic, or semiconductor materials (e.g., silicon).

Referring to FIG. 7A, a person of ordinary skill in the art can select the height of the seal 78 and features of the backplane 74 such that the desiccant 80 is sufficiently distanced from the interferometric modulator array 76. The height of the seal 78 is directly proportional to the height of the sealant wall 810. In certain embodiments, the seal 78 is preferably formed to a height of about 100-300 µm. In other embodiments, the seal 78 is preferably formed to a height of less than about 400 µm. In other embodiments, the seal 78 is preferably formed to a thickness greater than about 50 µm. The skilled artisan will appreciate that the thickness of the seal 78 may depend on various factors, such as the desired lifetime of the interferometric modulator array 76, the material of the seal 78, the amount of contaminants and moisture that are estimated to permeate into the package structure 70 during the lifetime of the array 76, the humidity of the ambient environment, and/or whether a desiccant 80 is included within the package structure 70.

Figure 9:
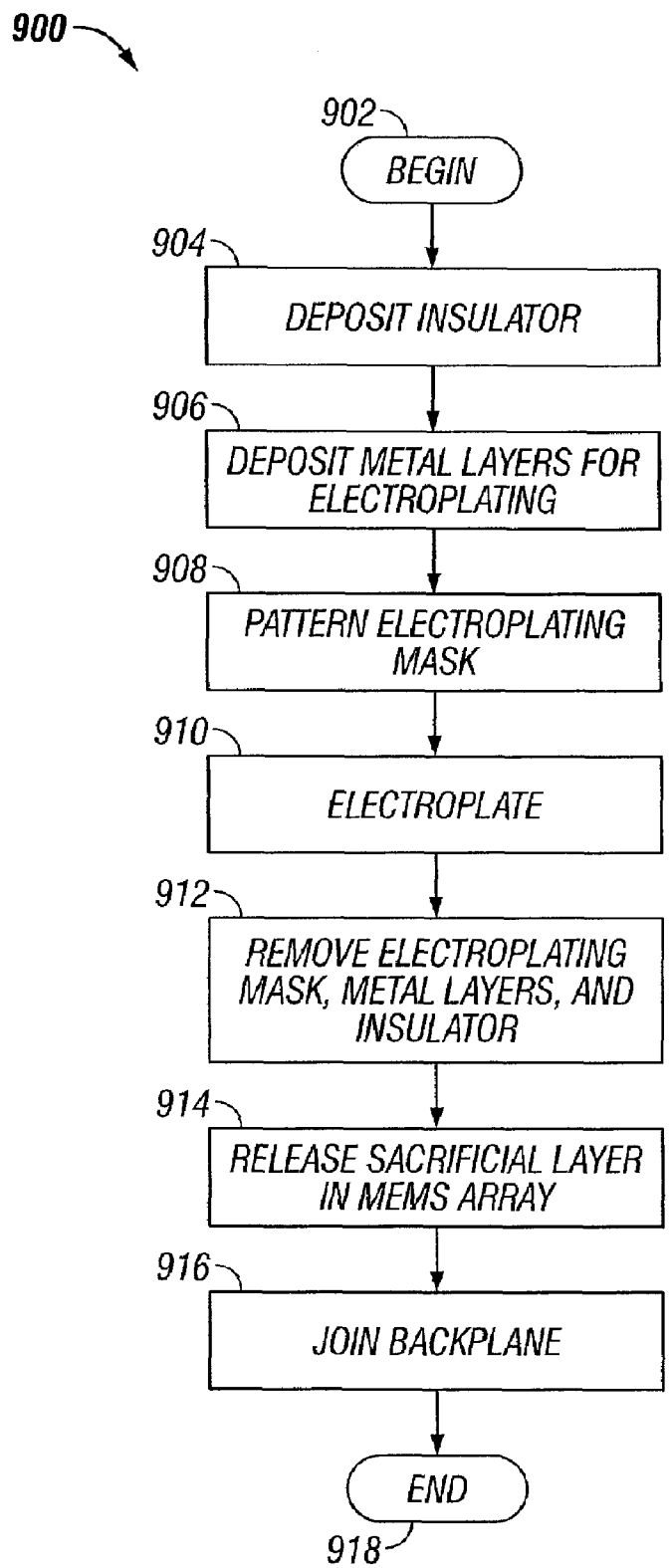
FIG. 9 is a flow chart illustrating one embodiment of a method of forming a plated metal seal for a MEMS packaging structure.

FIG. 9 is a process flow diagram illustrating one embodiment of a method of forming a metal seal and packaging a MEMS device. In some embodiments, the structure illustrated in FIG. 8A is the beginning structure for performance of the method 900 of FIG. 9, which begins in a step 902. The method 900 proceeds to a step 902 wherein the seal is electrically isolated from conductive leads located on the substrate by depositing an insulator over the substrate and the interferometric modulator array, as illustrated in FIG. 8B.

Following deposition of the insulator in step 904, one or more metal layers for electroplating are deposited directly on top of the insulator in a step 906. As discussed above in reference to FIG. 8B, the one or more metal layers may comprise a plurality of layers, and in one embodiment, the metal layers include an adhesion layer and a metal seed layer. In a step 908, a mask is patterned over the metal layers formed in step 906 in order to define one or more cavities 808 for the formation of the sealant wall proximate to a perimeter of the interferometric modulator array.

In a step 910, electroplating is performed using an electroplating bath to deposit one or more layers of metal onto the exposed metal seed layer in the cavity formed in step 908, thereby forming a sealant wall. Electroplating is capable of depositing over half of the elements of the periodic table. In one embodiment, the preferred electroplating metal is nickel, however, copper and tin may also be used. Electroplating is an efficient method of achieving the desired thickness of the seal, which is in the order of tens to hundreds of microns. Methods other than electroplating may be used to deposit metal for the sealant wall including electroless plating, evaporation, and sputtering, for example.

Step 910 may also include electroplating a backplane adhesion layer to the sealant wall, wherein the backplane adhesion layer comprises a solder, such as PbSn, InSb, SnBi, or other solders capable of being plated. In some embodiments, the backplane adhesion layer comprises multiple layers, such as a wettable metal layer and a solder layer.

In a step 912, the mask, metal layers, and insulator are removed at areas not covered by the electroplated metal by a method such as a wet chemical etch. Alternatively, the metal layers 804 and insulator 802 may each be removed in separate steps. The metal seed layer may be removed by ion milling, for example. In the embodiment wherein the metal seed layer is deposited on top of the mask 806, the metal seed layer is removed with the mask 806.

In step 914, prior to joining the backplane to the sealant wall, the sacrificial layer present in the interferometric modulator array is etched, using $XeF_2$ gas for example, to release the membranes or conductive members of the interferometric modulator elements of the array. Retaining the sacrificial layer through the seal formation process 900 may be preferable to protect the array from damage that can occur during any steps of the seal forming process 900. However, the sacrificial molybdenum can be removed any other times during the fabrication process.

In a step 916, after the sacrificial layer is removed in step 914, the backplane is joined to the sealant wall to form the package structure. In one embodiment the backplane is joined to the sealant wall by solder to create a hermetic joint. The solder can be deposited on the sealant wall as discussed in reference to step 910, can be applied after steps 912 and/or 914, or can be applied to the backplane. The solder preferably melts and flows at a temperature less than about 250° C. so as to avoid heat damage to the interferometric modulator array 76.

The backplane may have one or more backplane adhesion layers deposited thereon for adhesion to the sealant wall, or wettable metal and/or solder deposited on the sealant wall. In one embodiment, the backplane comprises an adhesion layer, such as a thin metal like Cr or Ti, or other material configured to withstand soldering temperatures, and solder is deposited on the adhesion layer for attachment of the backplane to the sealant wall. In one embodiment, the backplane comprises a metal that is readily solderable. In another embodiment, the backplane comprises a thin film of metal or a path of metal that is soldered to the sealant wall or joined using a seamseal. The formation of the seal 78 reduces the complexity of the packaging process by making the formation of the seal part of the array process.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. Additionally, the steps which are described and illustrated herein is not limited to the exact sequence of acts described, nor is it necessarily limited to the practice of all of the acts set forth. Other sequences of events or acts, or less than all of the events, or simultaneous occurrence of the events, may be utilized in practicing the embodiments of the invention. As will be recognized, the present invention may be embodied within a form that does not provide all of the features and benefits set forth herein, as some features may be used or practiced separately from others.

What is claimed is:

1. An electronic device comprising a micro-electromechanical systems (MEMS) device, a metal layer, a mask, a metal seal layer, and a backplane prepared by a process comprising:
 providing a MEMS device on a substrate;
 depositing a metal layer on the substrate;
 forming a mask with one or more perimeter cavities over the metal layer;
 depositing one or more metal seal layers in the one or more perimeter cavities, thereby forming a seal proximate to the perimeter cavities of the MEMS device; and
 joining a backplane to the seal.

2. The electronic device of claim 1, wherein the MEMS device comprises an interferometric modulator.

3. The electronic device of claim 1 further prepared by a process comprising removing the mask, and the metal layer, at areas not covered by the one or more metal seal layers, thereby forming a sealant wall.

4. The electronic device of claim 3 further prepared by a process comprising removing a sacrificial layer from the MEMS device.

5. The electronic device of claim 1 further prepared by a process comprising applying a desiccant between the MEMS device and the backplane.

6. The electronic device of claim 5, wherein the desiccant is selected from the group consisting of zeolites, molecular sieves, surface adsorbents, bulk adsorbents and chemical reactants.

7. The electronic device of claim 1, wherein the desiccant comprises a powder.

8. The electronic device of claim 1, wherein the seal proximate to the perimeter of the MEMS device comprises a non-hermetic seal.

9. The electronic device of claim 8, wherein the non-hermetic seal is selected from the group consisting of conventional epoxy-based adhesive, polyisobutylene, butyl rubber, o-rings, polyurethane, thin film metal weld, liquid spin-on glass, solder, polymers and plastic.

10. The electronic device of claim 1, wherein the seal proximate to the perimeter of the MEMS device comprises a substantially hermetic seal.

11. The electronic device of claim 10, wherein the substantially hermetic seal comprises metal.

12. The electronic device of claim 1 further prepared by depositing an insulator layer on the substrate before depositing the metal layer.

13. The electronic device of claim 12, wherein the depositing the insulator layer comprises depositing the insulator layer to contact the substrate.

14. The electronic device of claim 12, wherein the depositing the insulator layer comprises depositing the insulator layer on at least one layer in contact with the substrate.

15. The electronic device of claim 14, wherein the at least one layer comprises a conductive material.

* * * * *